United States Patent
Tarui et al.

(10) Patent No.: US 9,362,391 B2
(45) Date of Patent: Jun. 7, 2016

(54) SILICON CARBIDE SEMICONDUCTOR DEVICE AND METHOD OF MANUFACTURING THE SAME

(75) Inventors: Yoichiro Tarui, Tokyo (JP); Eisuke Suekawa, Tokyo (JP); Naoki Yutani, Tokyo (JP); Shiro Hino, Tokyo (JP); Naruhisa Miura, Tokyo (JP); Masayuki Imaizumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/240,017

(22) PCT Filed: Sep. 21, 2011

(86) PCT No.: PCT/JP2011/071485
§ 371 (c)(1),
(2), (4) Date: Feb. 20, 2014

(87) PCT Pub. No.: WO2013/042225
PCT Pub. Date: Mar. 28, 2013

(65) Prior Publication Data
US 2014/0191251 A1    Jul. 10, 2014

(51) Int. Cl.
*H01L 29/78* (2006.01)
*H01L 29/66* (2006.01)
(Continued)

(52) U.S. Cl.
CPC .......... *H01L 29/78* (2013.01); *H01L 21/02529* (2013.01); *H01L 21/046* (2013.01);
(Continued)

(58) Field of Classification Search
CPC ....... H01L 27/108; H01L 29/12; H01L 21/28; H01L 29/16
USPC ............................ 438/285, 197; 257/77, 301
See application file for complete search history.

(56) References Cited

U.S. PATENT DOCUMENTS 6,204,097 B1 * 3/2001 Shen .................. H01L 29/0634
257/E21.383
6,482,704 B1   11/2002 Amano et al.
(Continued)

FOREIGN PATENT DOCUMENTS

CN    1431715 A    7/2003
CN    101933146 A  12/2010
(Continued)

OTHER PUBLICATIONS

An Office Action; "Notice of Reasons for Rejection," issued by the Japanese Patent Office on Jun. 3, 2014, which corresponds to Japanese Patent Application No. 2013-534529 and is related to U.S. Appl. No. 14/240,017; with English language partial translation.
(Continued)

*Primary Examiner* — Selim Ahmed
(74) *Attorney, Agent, or Firm* — Studebaker & Brackett PC

(57) ABSTRACT

It is expected that both reduction of the resistance of a source region and reduction of a leakage current in a gate oxide film be achieved in an MOSFET in a silicon carbide semiconductor device. A leakage current to occur in a gate oxide film of the MOSFET is suppressed by reducing roughness at an interface between a source region and the gate oxide film. If an impurity concentration is to become high at a surface portion of the source region, the gate oxide film is formed by dry oxidation or CVD process. If the gate oxide film is formed by wet oxidation, the impurity concentration at the surface portion of the source region is controlled at a low level.

16 Claims, 4 Drawing Sheets

(51) Int. Cl.
  *H01L 29/08* (2006.01)
  *H01L 29/16* (2006.01)
  *H01L 21/04* (2006.01)
  *H01L 21/02* (2006.01)

(52) U.S. Cl.
  CPC .......... *H01L21/0485* (2013.01); *H01L 29/086* (2013.01); *H01L 29/1608* (2013.01); *H01L 29/66068* (2013.01); *H01L 29/66477* (2013.01); *H01L 29/7802* (2013.01)

(56) References Cited

U.S. PATENT DOCUMENTS

| | | | |
|---|---|---|---|
| 6,521,515 | B1 | 2/2003 | Kluth |
| 7,074,643 | B2 | 7/2006 | Ryu |
| 7,381,992 | B2 | 6/2008 | Ryu |
| 8,138,504 | B2 | 3/2012 | Harada et al. |
| 2003/0127695 | A1 | 7/2003 | Ozawa et al. |
| 2004/0104429 | A1* | 6/2004 | Takahashi et al. ............ 257/338 |
| 2005/0001217 | A1* | 1/2005 | Kusumoto ............ H01L 21/046 257/77 |
| 2005/0014354 | A1 | 1/2005 | Ozawa et al. |
| 2010/0308343 | A1* | 12/2010 | Suzuki ................ H01L 21/0465 257/77 |

FOREIGN PATENT DOCUMENTS

| | | | |
|---|---|---|---|
| JP | H11-297712 | A | 10/1999 |
| JP | 2001-210637 | A | 8/2001 |
| JP | 2006-066438 | A | 3/2006 |
| JP | 2006-524433 | A | 10/2006 |
| JP | 2008-294048 | A | 12/2008 |
| JP | 2010-251589 | A | 11/2010 |
| JP | 2011-129547 | A | 6/2011 |
| JP | 2011-165941 | A | 8/2011 |
| WO | 2004/097926 | A1 | 11/2004 |
| WO | 2008/056698 | A1 | 5/2008 |

OTHER PUBLICATIONS

An Office Action; "Decision of Refusal," issued by the Japanese Patent Office on Feb. 3, 2015, which corresponds to Japanese Patent Application No. 2013-534529 and is related to U.S. Appl. No. 14/240,017; with English language partial translation.

Notification of Concerning Transmittal of International Preliminary Report on Patentability and Translation of Written Opinion of the International Searching Authority; PCT/JP2011/071485 issued on Apr. 3, 2014.

The First Korean Office Action issued by the Korean Patent Office on Apr. 10, 2015, which corresponds to Korean Patent Application No. 10-2014-7006989 and is related to U.S. Appl. No. 14/240,017; with English language partial translation.

International Search Report; PCT/JP2011/071485; Dec. 27, 2011.

The First Korean Office Action issued by the Korean Patent Office on Jul. 17, 2015, which corresponds to Korean Patent Application No. 10-2015-7015299 and is related to U.S. Appl. No. 14/240,017; with English language partial translation.

An Office Action; "Decision of Refusal," issued by the Korean Patent Office on Jan. 13, 2016, which corresponds to Korean Patent Application No. 10-2015-7015299 and is related to U.S. Appl. No. 14/240,017; with English language translation.

An Office Action; "Decision of Refusal," issued by the Korean Patent Office on Oct. 19, 2015, which corresponds to Korean Patent Application No. 10-2014-7006989 and is related to U.S. Appl. No. 14/240,017; with English language partial translation.

The First Office Action issued by the Chinese Patent Office on Dec. 28, 2015, which corresponds to Chinese Patent Application No. 201180073630.6 and is related to U.S. Appl. No. 14/240,017; with English language partial translation.

* cited by examiner

F I G. 8
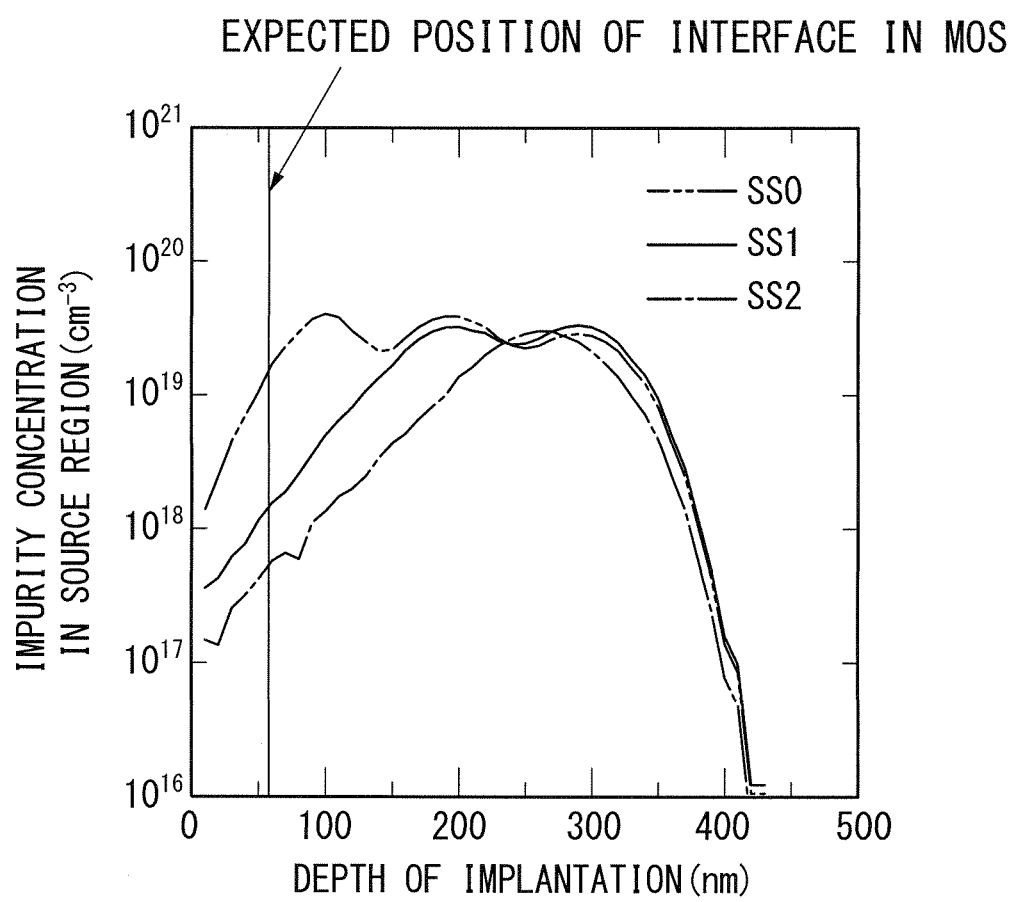

SILICON CARBIDE SEMICONDUCTOR DEVICE AND METHOD OF MANUFACTURING THE SAME

TECHNICAL FIELD

The present invention relates to a silicon carbide semiconductor device and more specifically, to a technique of reducing a leakage current in a gate oxide film in an MOSFET (metal-oxide-semiconductor field-effect transistor).

BACKGROUND ART

In recent years, a semiconductor device using silicon carbide (SiC) has been regarded as a promising next-generation switching element capable of achieving higher breakdown voltage, lower loss, and higher resistance to heat, and is expected to be applied in a power semiconductor device such as an inverter. However, the silicon carbide semiconductor device has many problems to be solved.

In an MOSFET formed by using silicon carbide, reducing the sheet resistance of a source region and reducing resistance of an ohmic contact between the source region and an electrode are important for reducing loss in an energized state. Hence, the source region should have a high impurity concentration. However, the high impurity concentration in the source region increases a leakage current in a gate oxide film on the source region.

The gate oxide film may be formed by process such as thermal oxidation process or chemical vapor deposition (CVD) process (as described in patent literatures 1 to 4, for example). The thermal oxidation process includes wet oxidation performed in an atmosphere containing oxygen ($O_2$) and water vapor ($H_2O$), and dry oxidation performed in an atmosphere containing oxygen but not containing water vapor.

PRIOR ART DOCUMENTS

Patent Literatures

Patent Literature 1: Japanese Patent Application Laid-Open No. 11-297712
Patent Literature 2: Japanese Republication of PCT Application Laid-Open No. 2008/056698
Patent Literature 3: Japanese Translation of PCT Application Laid-Open No. 2006-524433
Patent Literature 4: Japanese Patent Application Laid-Open No. 2001-210637

SUMMARY OF INVENTION

Problems to be Solved by Invention

As described above, in an MOSFET formed by using silicon carbide, increasing an impurity concentration in a source region reduces the resistance of the source region while increasing a leakage current in a gate oxide film. Conversely, reducing the impurity concentration in the source region increases the resistance of the source region while it could reduce the leakage current in the gate oxide film. Specifically, in the conventional MOSFET, reducing the resistance of the source region and reducing the leakage current in the gate oxide film are tradeoffs.

The present invention has been made to solve the aforementioned problem. It is an object of the present invention to provide a silicon carbide semiconductor device and a method of manufacturing the same capable of achieving both reduction of the resistance of a source region of an MOSFET and reduction of a leakage current in a gate oxide film of the MOSFET.

Means for Solving Problems

A silicon carbide semiconductor device according to a first aspect of the present invention includes an MOSFET that includes: a well region formed in an upper surface portion of a silicon carbide semiconductor layer; a source region formed in an upper surface portion of the well region; a gate oxide film formed on the well region and the source region; and a gate electrode formed on the gate oxide film. An impurity concentration at an upper surface portion of the source region is $1\times10^{18}$ cm$^{-3}$ or less.

A silicon carbide semiconductor device according to a second aspect of the present invention includes an MOSFET that includes: a well region formed in an upper surface portion of a silicon carbide semiconductor layer; a source region formed in an upper surface portion of the well region; a gate oxide film formed on the well region and the source region; and a gate electrode formed on the gate oxide film. An impurity concentration at an upper surface portion of the source region is $1\times10^{18}$ cm$^{-3}$ or more. The gate oxide film is formed by performing at least dry oxidation or CVD process first.

Advantageous Effects of Invention

According to the present invention, even if the impurity concentration in the source region is increased with the intention of reducing the resistance of the source region of the MOSFET, roughness to occur at an interface with the gate oxide film becomes small and a leakage current in the gate oxide film can be reduced. This makes it possible to achieve both reduction of the resistance of the source region of the MOSFET and reduction of a leakage current in the gate oxide film of the MOSFET.

BRIEF DESCRIPTION OF DRAWINGS

FIG. 8 is a view showing an expected position of an interface between a gate oxide film and a source region of an MOSFET.

DESCRIPTION OF EMBODIMENT(S)

Figure 1:
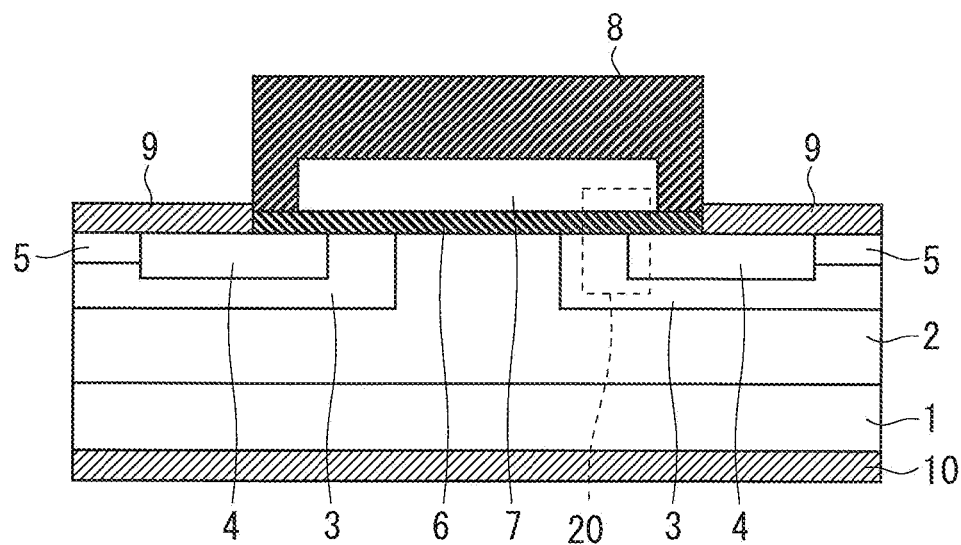
FIG. 1 is a sectional view showing an exemplary structure of an MOSFET.
Figure 2:
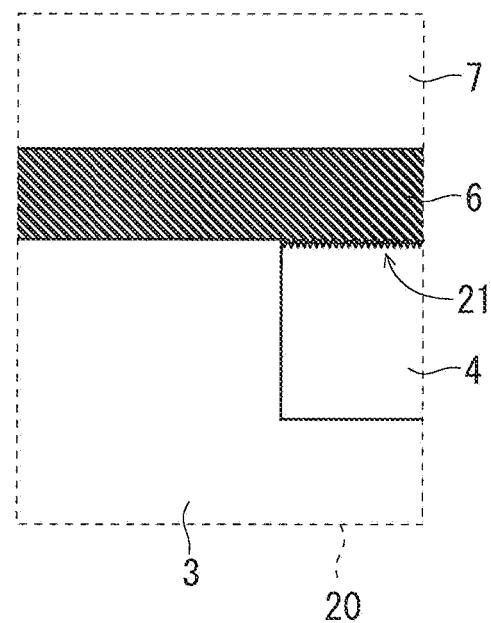
FIG. 2 is an enlarged sectional view of a source region and its vicinity of the MOSFET.

FIG. 1 is a sectional view showing an exemplary structure of an MOSFET formed by using silicon carbide (hereinafter simply called an "MOSFET"). FIG. 2 is an enlarged sectional view of an area 20 of FIG. 1. This MOSFET is formed by using an epitaxial substrate composed of an n$^+$-type SiC substrate 1 and an n⁻-type SiC epitaxial layer 2 grown on the SiC substrate 1. The SiC epitaxial layer 2 functions as a drift layer of the MOSFET.

P-type well regions 3 are selectively formed in an upper surface portion of the SiC epitaxial layer 2. N⁻-type source regions 4 and p⁺-type contact regions 5 are selectively formed in upper surface portions of the corresponding well regions 3. In the SiC epitaxial layer 2, an n-type region neighboring the well regions 3 (region between the well regions 3) is called a "JFET region."

A gate oxide film 6 is formed on the upper surface of the SiC epitaxial layer 2 so as to extend across the source regions 4, the well regions 3, and the JFET region. A gate electrode 7 is provided on the gate oxide film 6. The gate electrode 7 is covered with an interlayer insulating film 8 from above. A contact hole is formed in the interlayer insulating film 8 so as to reach the upper surfaces of the source regions 4 and the contact regions 5. A source electrode 9 connected to the source regions 4 and the contact regions 5 is formed in the contact hole. The source electrode 9 is electrically connected to the source regions 4 and is also electrically connected to the well regions 3 via the contact regions 5. A drain electrode 10 is arranged on the lower surface of the SiC substrate 1.

Figure 3:
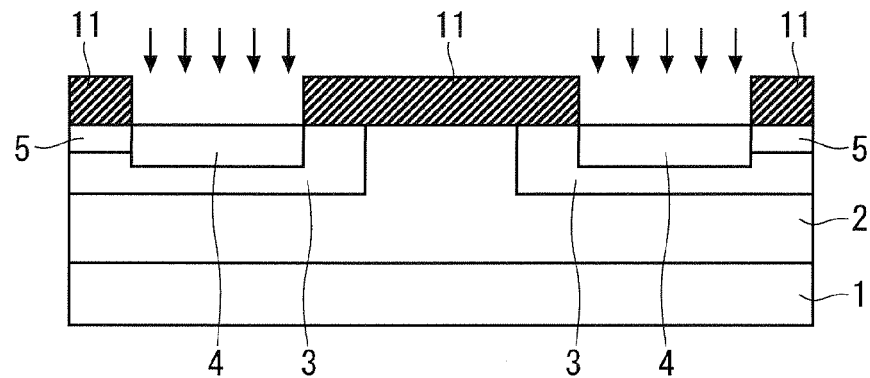
FIG. 3 is a view of manufacturing process of the MOSFET.

A method of forming the MOSFET 1 of FIG. 1 is described next by referring to the process views of FIGS. 3 to 5. First, an epitaxial substrate composed of the n⁺-type SiC substrate 1 and the n⁻-type epitaxial layer 2 is prepared. Then, impurities (dopants) are implanted into the SiC epitaxial layer 2 by selective ion implantation using an implantation mask (such as photoresist) of a certain pattern, thereby forming the p-type well regions 3, the n-type source regions 4, and the p⁺-type contact regions 5 (FIG. 3). FIG. 3 shows formation of the source regions 4 by ion implantation using an implantation mask 11.

Next, annealing process is performed to activate the ion-implanted impurities and recover a crystal defect caused by the ion implantation.

Figure 4:
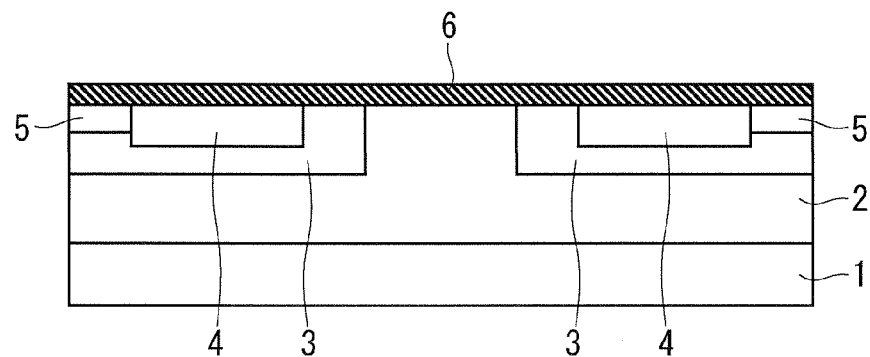
FIG. 4 is a view of the manufacturing process of the MOSFET.
Figure 5:
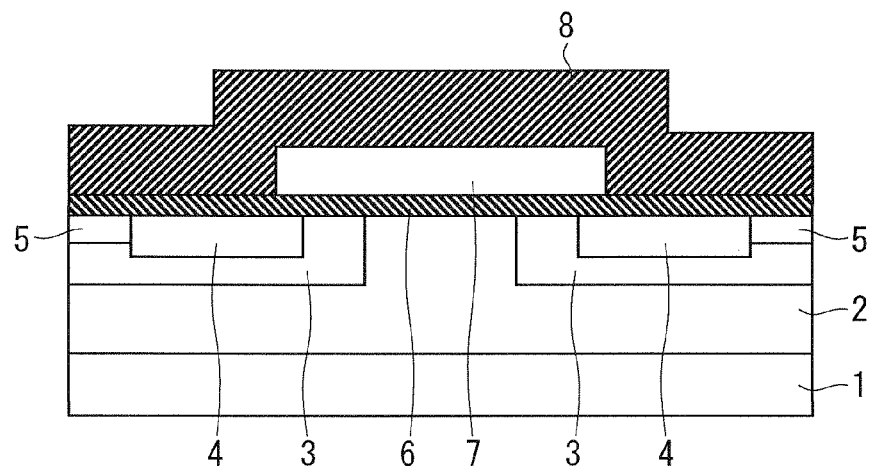
FIG. 5 is a view of the manufacturing process of the MOSFET.

Sacrificial oxidation is performed thereafter to form the gate oxide film 6 on the upper surface of the SiC epitaxial layer 2 (FIG. 4). Then, an electrode material such as polysilicon is deposited on the gate oxide film 6 and is patterned, thereby forming the gate electrode 7. Next, the interlayer insulating film 8 is formed on the entire SiC epitaxial layer 2 so as to cover the gate electrode 7 (FIG. 5).

Next, selective etching is performed to form the contact hole in the interlayer insulating film 8 reaching the upper surfaces of the source regions 4 and the contact regions 5, and the source electrode 9 is formed in the contact hole. Finally, the drain electrode 10 is formed on the lower surface of the SiC substrate 1, thereby providing the MOSFET of the structure shown in FIG. 1.

While not shown in the drawings, a pad electrode connected to each of the source electrode 9 and the gate electrode 7, a field oxide film, a protective film and the like are formed, thereby completing the semiconductor device.

A problem relating to a leakage current in the MOSFET is described next. FIG. 2 is an enlarged sectional view of the source region 4 and its vicinity of the MOSFET showing a part corresponding to the area 20 of FIG. 1.

As described above, the source region 4 is formed by ion-implanting impurities (dopants) into the SiC epitaxial layer 2. As a result of an analysis carried out by the present inventors, it was found that forming the source region 4 of a high impurity concentration by ion implantation causes serious roughness 21 (unevenness) at an interface between the source region 4 and the gate oxide film 6 thereon as shown in FIG. 2, and this roughness 21 is a cause for increase of a leakage current in the gate oxide film 6.

The present inventors produced MOSFETs by way of trial by employing different methods for forming the gate oxide film 6 and by forming different impurity implantation profiles in the source region 4. Then, the present inventors investigated the dependence of the size of the roughness 21 at the interface between the source region 4 and the gate oxide film 6 on the method of forming the gate oxide film 6 and the impurity implantation profile in the source region 4.

Figure 6:
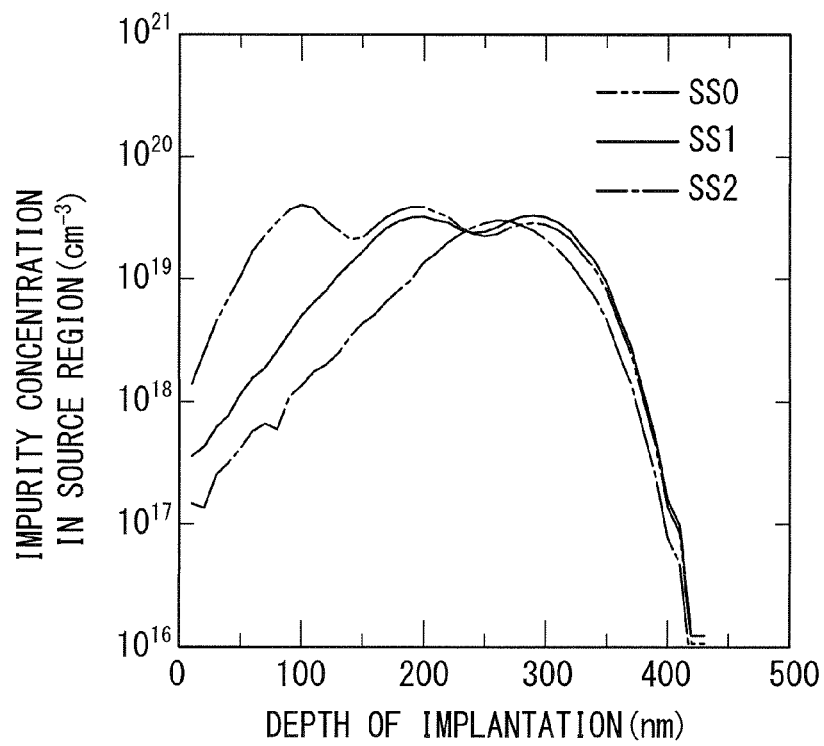
FIG. 6 is a view showing representative examples of impurity implantation profiles in source regions of MOSFETs produced by way of trial.

FIG. 6 is a graph showing representative examples of impurity implantation profiles (profiles SS0, SS1 and SS2) in the source regions 4 of the MOSFETs produced by way of trial. The horizontal axis of the graph corresponds to a depth from a surface of the source region 4 (surface of the SiC epitaxial layer 2).

Regarding the profile SS0, the source region 4 has an impurity concentration which peaks at a level of $1 \times 10^{19}$ cm⁻³ and which is $1 \times 10^{18}$ cm⁻³ or more at a surface portion of the source region 4. Regarding the profile SS1, the source region 4 has an impurity concentration which peaks at a level of $1 \times 10^{19}$ cm⁻³ and which is $1 \times 10^{18}$ cm⁻³ or less at the surface portion of the source region 4. Regarding the profile SS2, the source region 4 has an impurity concentration which peaks at a level of $1 \times 10^{19}$ cm⁻³ and which is $5 \times 10^{17}$ cm⁻³ or less at the surface portion of the source region 4.

Figure 7:
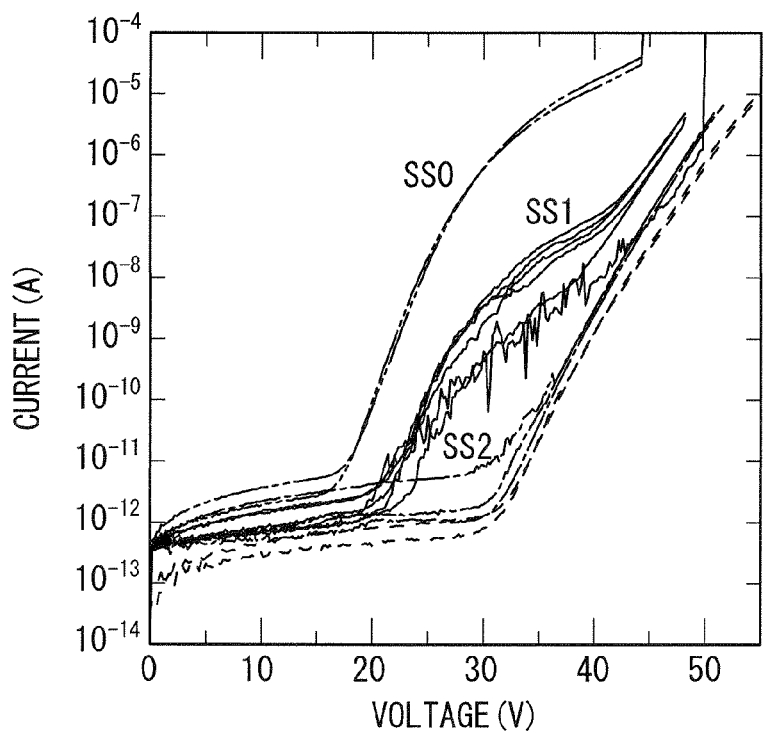
FIG. 7 is a view showing current-voltage characteristics of gate oxide films of MOSFETs produced by way of trial.

FIG. 7 is a graph showing current-voltage characteristics (I-V characteristics) of the gate oxide films 6 formed by wet oxidation of MOSFETs having impurity implantation profiles with specifications corresponding to those of the aforementioned profiles SS0, SS1 and SS2. In FIG. 7, a curve of the lowest current value (dashed curve) shows the I-V characteristics of the gate oxide film 6 obtained in the absence of ion implantation for forming the source region 4.

As shown in FIG. 7, a leakage current in the gate oxide film 6 is large if an impurity implantation profile in the source region 4 is the profile SS0, and is controlled at a low level if the impurity implantation profile in the source region 4 is the profile SS1 or SS2. This means that a lower impurity concentration at the surface portion of the source region 4 suppresses a leakage current in the gate oxide film 6 more. In particular, in the case of the profile SS2, resultant I-V characteristics become substantially the same as those obtained in the absence of the source region 4, showing that a leakage current is reduced satisfactorily.

The present inventors also carried out the same experiment on MOSFETs produced by way of trial with the gate oxide films 6 formed by dry oxidation. It was found that if the gate oxide film 6 is formed by dry oxidation, a leakage current in the gate oxide film 6 is not affected by an impurity implantation profile in the source region 4 but it can be controlled at a level substantially the same as a level obtained in the absence of the source region 4.

The present inventors further analyzed the section of each MOSFET produced by way of trial. In an MOSFET with the gate oxide film 6 formed by wet oxidation, roughness occurring at the interface between the source region 4 and the gate oxide film 6 has a size of 1 nm or more if an impurity implantation profile in the source region 4 is the profile SS0. In contrast, if the impurity implantation profile in the source region 4 is the profile SS2, roughness occurring at the interface between the source region 4 and the gate oxide film 6 is controlled to a size not exceeding 1 nm. It was also found that many crystal defects remain in the source region 4, especially in an area thereof where an impurity concentration is $1 \times 10^{19}$ cm⁻³ or more.

Meanwhile, in an MOSFET with the gate oxide film 6 formed by dry oxidation, roughness at the interface between the source region 4 and the gate oxide film 6 is small regardless of whether an impurity implantation profile in the source region 4 is the profile SS0, SS1 or SS2. Even if the impurity implantation profile in the source region 4 is the profile SS0, the size of roughness at the interface between the source region 4 and the gate oxide film 6 does not exceed 1 nm.

As a result, it is considered that a leakage current in the gate oxide film 6 is caused by the following mechanism.

Regarding SiC, crystal defects formed densely by ion implantation are known to cause enhanced oxidation where oxidation proceeds at speed higher than that observed in the absence of crystal defects. In an MOSFET where impurities are implanted such that the concentration thereof becomes high even at the surface portion of the source region 4, enhanced oxidation occurs when the gate oxide film 6 is formed on the source region 4. Hence, oxidation proceeds rapidly in an area with crystal defects and it proceeds slowly in an area without crystal defects. Si is known to achieve higher anisotropy by wet oxidation than that achieved by dry oxidation, and SiC is considered to have the corresponding property. Further, according to the properties of SiC, anisotropy of oxidation speed depends on crystal plane orientation.

Increase of a leakage current in the gate oxide film 6, formed by wet oxidation of a surface of the source region 4 where impurities are ion-implanted such that the concentration thereof becomes high even at the surface portion of the source region 4, is considered to be due to large roughness at the interface between the gate oxide film 6 and the source region 4 occurring as a result of the aforementioned properties of SiC.

Hence, a leakage current in the gate oxide film 6 is suppressed effectively by controlling occurrence of roughness at the interface between the gate oxide film 6 and the source region 4. Specifically, a leakage current is suppressed effectively by forming the gate oxide film 6 by dry oxidation, or by reducing an impurity concentration at the surface portion of the source region 4 if the gate oxide film 6 is formed by wet oxidation.

If being formed by depositing an oxide film by CVD process, the gate oxide film 6 can be free from the influence of a crystal defect at the surface portion of the source region 4. Thus, like in the case where the gate oxide film 6 is formed by dry oxidation, this is considered to suppress roughness to occur at the interface between the source region 4 and the gate oxide film 6, thereby controlling leakage increase in the gate oxide film 6.

In the MOSFETS produced by way of trial in the aforementioned experiments, the gate oxide film 6 has a thickness of from 40 to 50 nm. In this case, in further consideration of sacrificial oxidation performed before formation of the gate oxide film 6, the interface between the source region 4 and the gate oxide film 6 is expected to be at a position shown in FIG. 8 relative to an impurity implantation profile in the source region 4. Increasing the thickness of the gate oxide film 6 formed by wet oxidation makes the bottom of the gate oxide film 6 reach a position of a high impurity concentration, even if an impurity concentration is lowered at the surface portion of the source region 4. In this case, it should be noted that roughness at the interface between the source region 4 and the gate oxide film 6 may become large.

In an MOSFET formed by using SiC, many interface states (traps) exist at an interface between a gate oxide film and an SiC layer. This causes a problem of reduced channel mobility and increased ON resistance of the MOSFET. It is known that this problem is alleviated by introducing nitrogen into an interface between the well region 3 and the gate oxide film 6 by high-temperature thermal process (nitriding process) using nitrogen oxide (NO) gas or dinitrogen oxide ($N_2O$) gas performed after formation of the gate oxide film 6. It was confirmed that nitriding process performed on an MOSFET formed by way of trial does not change a leakage current in the gate oxide film 6 so that the effect of reducing the leakage current achieved by suppressing roughness at the interface between the source region 4 and the gate oxide film 6 is maintained.

It is concluded based on a result of the experiments carried out by the present inventors that the following methods work effectively for preventing increase of a leakage current in the gate oxide film 6, even if impurities are ion-implanted to a high concentration with the intention of reducing the resistance of an MOSFET.

<Impurity Concentration in Source Region>

If the gate oxide film 6 is formed by wet oxidation, a leakage current in the gate oxide film 6 can be suppressed by controlling an impurity concentration at a low level at the surface portion of the source region 4. More specifically, it is desirable that the impurity concentration should become $1 \times 10^{18}$ cm$^{-3}$ or less and more preferably, should become $5 \times 10^{17}$ cm$^{-3}$ or less at the surface portion of the source region 4. Meanwhile, in terms of reducing the resistance of the source region 4, it is desirable that the impurity concentration in the source region 4 should peak at a high level (such as $1 \times 10^{18}$ cm$^{-3}$ or more, for example).

As is described later, forming the gate oxide film 6 by dry oxidation or CVD process can suppress increase of a leakage current in the gate oxide film 6, even if an impurity concentration at the surface portion of the source region 4 is higher than $1 \times 10^{18}$ cm$^{-3}$.

<Process for Forming Gate Oxide Film>

Where an impurity concentration is to become high ($1 \times 10^{18}$ cm$^{-3}$ or more) even at the surface portion of the source region 4 with the intention of reducing the sheet resistance and the contact resistance of the source region 4, forming the gate oxide film 6 by dry oxidation or CVD process is an effective way. Forming the gate oxide film 6 by dry oxidation or CVD process can reduce roughness to occur at the interface between the source region 4 and the gate oxide film 6, so that a leakage current can be suppressed in the gate oxide film 6.

If an impurity concentration is $1 \times 10^{18}$ cm$^{-3}$ or less (more preferably, $5 \times 10^{17}$ cm$^{-3}$ or less) at the surface portion of the source region 4, roughness to occur at the interface between the source region 4 and the gate oxide film 6 is reduced regardless of whether the gate oxide film 6 is formed by dry oxidation, wet oxidation or CVD process. Thus, increase of a leakage current can be suppressed in the gate oxide film 6.

The gate oxide film 6 may be formed by a combination of dry oxidation, wet oxidation and CVD process. An oxide film formed by thermal oxidation process (dry oxidation and wet oxidation) is deposited at low speed. Thus, combining thermal oxidation process with CVD process can form the gate oxide film 6 with a high throughput.

If formed by performing thermal oxidation process (wet oxidation or dry oxidation) first and then CVD process, the resultant gate oxide film 6 becomes a two-layer structure composed of a lower layer formed by thermal oxidation process and an upper layer formed by CVD process. Accordingly, the size of roughness to occur at the interface between the source region 4 and the gate oxide film 6 depends on deposition process performed first in a step of forming the gate oxide film 6.

If the gate oxide film 6 is deposited by performing wet oxidation first and then CVD process, a high impurity concentration at the surface portion of the source region 4 causes large roughness at the interface between the gate oxide film 6 and the source region 4. Thus, it is desirable in this case that the impurity concentration at the surface portion of the source region 4 should become $1 \times 10^{18}$ cm$^{-3}$ or less and more preferably, should become $5 \times 10^{17}$ cm$^{-3}$ or less, like in the case where the gate oxide film 6 is formed only by wet oxidation.

If the gate oxide film 6 is deposited by performing dry oxidation first and then CVD process, large roughness does not occur at the interface between the gate oxide film 6 and the source region 4, even if an impurity concentration is high at the surface portion of the source region 4. Thus, in this case, reduction of the resistance of the source region 4 is expected by setting an impurity concentration at the surface portion of the source region 4 at $1 \times 10^{18}$ cm$^{-3}$ or more, like in the case where the gate oxide film 6 is formed only by dry oxidation.

Conversely, if the gate oxide film 6 is deposited by performing CVD process first and then thermal oxidation process (wet oxidation or dry oxidation), the quality of an oxide film formed by CVD process is changed by thermal oxidation so that the resultant gate oxide film 6 becomes a single-layer structure. In this case, the shape of the interface between the source region 4 and the gate oxide film 6 shows little change from a state at the time when the gate oxide film 6 is deposited by CVD process. Hence, the size of roughness to occur at this interface becomes substantially the same as that of roughness to occur if the gate oxide film 6 is formed only by CVD process.

Hence, where the gate oxide film 6 is deposited by performing CVD process first and then thermal oxidation process (wet oxidation or dry oxidation), roughness to occur at the interface between the gate oxide film 6 and the source region 4 becomes small, even if an impurity concentration is high at the surface portion of the source region 4. Thus, in this case, reduction of the resistance of the source region 4 is expected by setting an impurity concentration at the surface portion of the source region 4 at $1 \times 10^{18}$ cm$^{-3}$ or more, like in the case where the gate oxide film 6 is formed only by CVD process.

<Others>

Channel mobility is enhanced and the resistance of an MOSFET can be reduced by introducing nitrogen into the interface between the well region 3 and the gate oxide film 6 by performing nitriding process after formation of the gate oxide film 6. Performing this nitriding process still maintains the effect of reducing a leakage current achieved by suppressing roughness at the interface between the source region 4 and the gate oxide film 6.

It is desirable that n-type impurities (dopants) to be implanted into the source region 4 be nitrogen (N) or phosphorous (P), as they achieve reduction of the sheet resistance and the contact resistance of the source region 4.

The embodiment of the present invention can be modified or omitted where appropriate without departing from the scope of the invention.

REFERENCE SIGNS LIST

1 SiC Substrate; 2 SiC epitaxial layer; 3 Well region; 4 Source region; 5 Contact region; 6 Gate oxide film; 7 Gate electrode; 8 Interlayer insulating film; 9 Source electrode; 10 Drain electrode; 11 Implantation mask; 21 Roughness.

The invention claimed is:

1. A silicon carbide semiconductor device comprising an MOSFET that includes:
    a well region formed in an upper surface portion of a silicon carbide semiconductor layer;
    a source region formed in an upper surface portion of said well region;
    a source electrode formed on said source region;
    a gate oxide film formed on said well region and said source region; and
    a gate electrode formed on said gate oxide film,
    wherein an impurity concentration at an upper surface portion of said source region is $1 \times 10^{18}$ cm$^{-3}$ or less,
    wherein a peak of the impurity concentration in said source region is $1 \times 10^{18}$ cm$^{-3}$ or more, and
    wherein the peak of the impurity concentration in said source region is in a location of the source region different from the surface portion of the source region at a depth deeper than an interface between said source region and a bottom surface of said source electrode.

2. The silicon carbide semiconductor device according to claim 1,
    said gate oxide film is formed by one or more of wet oxidation, dry oxidation, and CVD process.

3. The silicon carbide semiconductor device according to claim 1, wherein nitrogen is introduced into an interface between said well region and said gate oxide film.

4. The silicon carbide semiconductor device according to claim 1, wherein impurities forming said source region are nitrogen or phosphorous.

5. The silicon carbide semiconductor device according to claim 1, wherein the interface between said source region and the bottom surface of said source electrode occurs at an uppermost surface of said source region.

6. The silicon carbide semiconductor device according to claim 1, wherein said depth is less than about 325 nm.

7. A silicon carbide semiconductor device comprising an MOSFET that includes:
    a well region formed in an upper surface portion of a silicon carbide semiconductor layer;
    a source region formed in an upper surface portion of said well region;
    a gate oxide film formed on said well region and said source region; and
    a gate electrode formed on said gate oxide film,
    wherein an impurity concentration at an upper surface portion of said source region is $1 \times 10^{18}$ cm$^{-3}$ or less,
    wherein a peak of the impurity concentration in said source region is $1 \times 10^{18}$ cm$^{-3}$ or more,
    wherein the peak of the impurity concentration in said source region is in a location of the source region different from the surface portion of the source region, and
    wherein the impurity concentration at the upper surface portion of said source region is $5 \times 10^{17}$ cm$^{-3}$ or less.

8. A method of manufacturing a silicon carbide semiconductor device, comprising the steps of:
    (a) forming a well region of an MOSFET by ion-implanting impurities of a first conductivity type into an upper surface portion of a silicon carbide semiconductor layer;
    (b) forming a source region of said MOSFET by ion-implanting impurities of a second conductivity type into an upper surface portion of said well region;
    (c) forming a source electrode on said source region;
    (d) forming a gate oxide film of said MOSFET on said well region and said source region; and
    (e) forming a gate electrode of said MOSFET on said gate oxide film, wherein a concentration of said impurities of said second conductivity type ion-implanted in said step (b) is $1\times10^{18}$ cm$^{-3}$ or less at an upper surface portion of said source region, wherein the concentration of said impurities of said second conductivity type ion-implanted into said source region in said step (b) peaks at $1\times10^{18}$ cm$^{-3}$ or more, and wherein the concentration of said impurities of said second conductivity type ion-implanted into said source region in said step (b) peaks at $1\times10^{18}$ cm$^{-3}$ or more in a location of the source region different from the surface portion of the source region at a depth deeper than an interface between said source region and a bottom surface of said source electrode.

9. The method of manufacturing a silicon carbide semiconductor device-according to claim 8, wherein in said step (d), said gate oxide film is formed by one or more of wet oxidation, dry oxidation, and CVD process.

10. The method of manufacturing a silicon carbide semiconductor device according to claim 8, further comprising the step of:
(f) performing thermal process using nitrogen oxide gas or dinitrogen oxide gas, the step (f) being performed after said step (d).

11. The method of manufacturing a silicon carbide semiconductor device according to claim 8, wherein said impurities of said second conductivity type are nitrogen or phosphorous.

12. The method of forming a silicon carbide semiconductor device according to claim 8, wherein the interface between said source region and the bottom surface of said source electrode occurs at an uppermost surface of said source region.

13. The method of forming a silicon carbide semiconductor device according to claim 8, wherein said depth is less than about 325 nm.

14. A method of manufacturing a silicon carbide semiconductor device, comprising the steps of:
(a) forming a well region of an MOSFET by ion-implanting impurities of a first conductivity type into an upper surface portion of a silicon carbide semiconductor layer;
(b) forming a source region of said MOSFET by ion-implanting impurities of a second conductivity type into an upper surface portion of said well region;
(c) forming a gate oxide film of said MOSFET on said well region and said source region; and
(d) forming a gate electrode of said MOSFET on said gate oxide film,
wherein a concentration of said impurities of said second conductivity type ion-implanted in said step (b) is $1\times10^{18}$ cm$^{-3}$ or less at an upper surface portion of said source region,
wherein the concentration of said impurities of said second conductivity type ion-implanted into said source region in said step (b) peaks at $1\times10^{18}$ cm$^{-3}$ or more, wherein the concentration of said impurities of said second conductivity type ion-implanted into said source region in said step (b) peaks at $1\times10^{18}$ cm$^{-3}$ or more in a location of the source region different from the surface portion of the source region, and wherein the concentration of said impurities of said second conductivity type ion-implanted in said step (b) is $5\times10^{17}$ cm$^{-3}$ or less at the upper surface portion of said source region.

15. A silicon carbide semiconductor device comprising an MOSFET that includes:
a well region formed in an upper surface portion of a silicon carbide semiconductor layer;
a source region formed in an upper surface portion of said well region;
a gate oxide film formed on said well region and said source region; and
a gate electrode formed on said gate oxide film,
wherein an impurity concentration at an upper surface portion of said source region is $1\times10^{18}$ cm$^{-3}$ or less,
wherein a peak of the impurity concentration in said source region is $1\times10^{18}$ cm$^{-3}$ or more,
wherein the peak of the impurity concentration in said source region is in a location of the source region different from the surface portion of the source region, and
wherein roughness at an interface between the source region and the gate oxide film is controlled to a size not exceeding 1 nm.

16. A method of manufacturing a silicon carbide semiconductor device, comprising the steps of:
(a) forming a well region of an MOSFET by ion-implanting impurities of a first conductivity type into an upper surface portion of a silicon carbide semiconductor layer;
(b) forming a source region of said MOSFET by ion-implanting impurities of a second conductivity type into an upper surface portion of said well region;
(c) forming a gate oxide film of said MOSFET on said well region and said source region; and
(d) forming a gate electrode of said MOSFET on said gate oxide film,
wherein a concentration of said impurities of said second conductivity type ion-implanted in said step (b) is $1\times10^{18}$ cm$^{-3}$ or less at an upper surface portion of said source region,
wherein the concentration of said impurities of said second conductivity type ion-implanted into said source region in said step (b) peaks at $1\times10^{18}$ cm$^{-3}$ or more,
wherein the concentration of said impurities of said second conductivity type ion-implanted into said source region in said step (b) peaks at $1\times10^{18}$ cm$^{-3}$ or more in a location of the source region different from the surface portion of the source region, and
wherein roughness at an interface between the source region and the gate oxide film is controlled to a size not exceeding 1 nm.

* * * * *